(12) United States Patent
Colpani et al.

(10) Patent No.: US 12,021,046 B2
(45) Date of Patent: Jun. 25, 2024

(54) REDISTRIBUTION LAYER AND INTEGRATED CIRCUIT INCLUDING REDISTRIBUTION LAYER

(71) Applicant: STMICROELECTRONICS S.r.l., Agrate Brianza (IT)

(72) Inventors: Paolo Colpani, Agrate Brianza (IT); Samuele Sciarrillo, Usmate Velate (IT); Ivan Venegoni, Bareggio (IT); Francesco Maria Pipia, Milan (IT); Simone Bossi, Arese (IT); Carmela Cupeta, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/944,983

(22) Filed: Sep. 14, 2022

(65) Prior Publication Data

US 2023/0005848 A1 Jan. 5, 2023

Related U.S. Application Data

(62) Division of application No. 16/535,029, filed on Aug. 7, 2019, now Pat. No. 11,469,194.

(30) Foreign Application Priority Data

Aug. 8, 2018 (IT) .......................... 102018000007967
Aug. 8, 2018 (IT) .......................... 102018000007968

(51) Int. Cl.
*H01L 23/00* (2006.01)
*H01L 21/02* (2006.01)
(Continued)

(52) U.S. Cl.
CPC ........ *H01L 24/03* (2013.01); *H01L 21/02164* (2013.01); *H01L 21/0217* (2013.01);
(Continued)

(58) Field of Classification Search
CPC ... H01L 24/03; H01L 24/05; H01L 21/02164; H01L 21/0217; H01L 21/76802;
(Continued)

(56) References Cited

U.S. PATENT DOCUMENTS 4,949,162 A 8/1990 Tamaki et al.
5,117,280 A 5/1992 Adachi
(Continued)

FOREIGN PATENT DOCUMENTS

CN 102709263 A 10/2012
CN 103165481 A 6/2013
(Continued)

OTHER PUBLICATIONS

Yee et al., "Palladium-Copper Inter-diffusion during Copper Activation for Electroless Nickel Plating Process on Copper Power Metal," 2014 IEEE 21st International Symposium on the Physical and Failure Analysis of Integrated Circuits (IPFA), pp. 219-222, Jun. 30-Jul. 4, 2014.

*Primary Examiner* — Eric W Jones
(74) *Attorney, Agent, or Firm* — Seed IP Law Group LLP

(57) ABSTRACT

A method of manufacturing a redistribution layer includes: forming an insulating layer on a wafer, delimited by a top surface and a bottom surface in contact with the wafer; forming a conductive body above the top surface of the insulating layer; forming a first coating region extending around and above the conductive body, in contact with the conductive body, and in contact with the top surface of the insulating layer in correspondence of a bottom surface of the first coating region; applying a thermal treatment to the wafer in order to modify a residual stress of the first coating region, forming a gap between the bottom surface of the first coating region and the top surface of the insulating layer; forming, after applying the thermal treatment, a second coating region extending around and above the first coating (Continued)

region, filling said gap and completely sealing the first coating region.

20 Claims, 8 Drawing Sheets

(51) Int. Cl.
*H01L 21/768* (2006.01)
*H01L 23/528* (2006.01)

(52) U.S. Cl.
CPC .. *H01L 21/76802* (2013.01); *H01L 21/76877* (2013.01); *H01L 23/528* (2013.01); *H01L 24/05* (2013.01); *H01L 2224/0231* (2013.01); *H01L 2224/0233* (2013.01); *H01L 2224/0239* (2013.01); *H01L 2224/024* (2013.01); *H01L 2224/03464* (2013.01); *H01L 2224/03614* (2013.01); *H01L 2224/04042* (2013.01); *H01L 2224/05024* (2013.01); *H01L 2224/05083* (2013.01); *H01L 2224/05147* (2013.01); *H01L 2224/05155* (2013.01); *H01L 2224/05166* (2013.01); *H01L 2224/05184* (2013.01); *H01L 2224/05664* (2013.01); *H01L 2924/01028* (2013.01); *H01L 2924/01029* (2013.01); *H01L 2924/01046* (2013.01); *H01L 2924/0132* (2013.01); *H01L 2924/05042* (2013.01); *H01L 2924/05442* (2013.01); *H01L 2924/20102* (2013.01); *H01L 2924/20103* (2013.01); *H01L 2924/20104* (2013.01); *H01L 2924/20105* (2013.01); *H01L 2924/20106* (2013.01); *H01L 2924/20107* (2013.01)

(58) Field of Classification Search
CPC ............. H01L 21/76877; H01L 23/528; H01L 2224/0231; H01L 2224/0233; H01L 2224/0239; H01L 2224/024; H01L 2224/03464; H01L 2224/03614; H01L 2224/04042; H01L 2224/05024; H01L 2224/05083; H01L 2224/05147; H01L 2224/05155; H01L 2224/05166; H01L 2224/05184; H01L 2224/05664; H01L 2924/01028; H01L 2924/01029; H01L 2924/01046; H01L 2924/0132; H01L 2924/05042; H01L 2924/05442; H01L 2924/20102; H01L 2924/20103; H01L 2924/20104; H01L 2924/20105; H01L 2924/20106; H01L 2924/20107
USPC ........................................................ 257/751
See application file for complete search history.

(56) References Cited

U.S. PATENT DOCUMENTS

| | | |
|---|---|---|
| 5,145,571 A | 9/1992 | Lane et al. |
| 5,223,454 A | 6/1993 | Uda et al. |
| 5,763,936 A | 6/1998 | Yamaha et al. |
| 5,885,857 A | 3/1999 | Yamaha et al. |
| 5,937,320 A | 8/1999 | Andricacos et al. |
| 6,090,696 A | 7/2000 | Jang et al. |
| 6,093,631 A | 7/2000 | Jaso et al. |
| 6,118,180 A | 9/2000 | Loo et al. |
| 6,228,759 B1 | 5/2001 | Wang et al. |
| 6,413,863 B1 | 7/2002 | Liu et al. |
| 6,417,089 B1 | 7/2002 | Kim et al. |
| 6,528,412 B1 | 3/2003 | Wang et al. |
| 6,570,243 B1 | 5/2003 | Hagihara |
| 6,756,294 B1 | 6/2004 | Chen et al. |
| 6,833,323 B2 | 12/2004 | Yui et al. |
| 7,192,495 B1 | 3/2007 | Collins |
| 7,947,592 B2 | 5/2011 | Dalal et al. |
| 8,298,930 B2 | 10/2012 | Arvin et al. |
| 8,476,762 B2 | 7/2013 | Daubenspeck et al. |
| 8,809,951 B2 | 8/2014 | Lin et al. |
| 8,884,418 B2 | 11/2014 | Camacho et al. |
| 9,224,686 B1 | 12/2015 | Chen et al. |
| 2005/0116340 A1 | 6/2005 | Shindo |
| 2005/0186772 A1 | 8/2005 | Brintzinger et al. |
| 2005/0215045 A1 | 9/2005 | Rinne et al. |
| 2006/0267198 A1 | 11/2006 | Lin et al. |
| 2007/0020906 A1 | 1/2007 | Chiu et al. |
| 2007/0023919 A1 | 2/2007 | Lin et al. |
| 2008/0121943 A1* | 5/2008 | Lin ................... H01L 21/76804 257/E27.081 |
| 2009/0102032 A1 | 4/2009 | Schneegans et al. |
| 2009/0127710 A1 | 5/2009 | Daubenspeck et al. |
| 2009/0302473 A1 | 12/2009 | Shibata et al. |
| 2010/0109159 A1 | 5/2010 | Ho et al. |
| 2010/0171219 A1 | 7/2010 | Moreau et al. |
| 2011/0095418 A1 | 4/2011 | Lim et al. |
| 2011/0147932 A1 | 6/2011 | Trezza et al. |
| 2011/0149137 A1 | 6/2011 | Koike |
| 2012/0064712 A1 | 3/2012 | Lei et al. |
| 2012/0129335 A1* | 5/2012 | Ikumo ................. H01L 23/3192 257/E21.159 |
| 2012/0139113 A1 | 6/2012 | Arvin et al. |
| 2012/0306085 A1 | 12/2012 | West |
| 2013/0099383 A1 | 4/2013 | Meyer-Berg et al. |
| 2014/0001615 A1 | 1/2014 | Otremba et al. |
| 2014/0312491 A1 | 10/2014 | Jin et al. |
| 2014/0327133 A1* | 11/2014 | Lin ......................... H01L 24/11 257/737 |
| 2014/0327134 A1 | 11/2014 | Lin |
| 2014/0361431 A1 | 12/2014 | Matsumoto et al. |
| 2015/0162397 A1 | 6/2015 | Chiou et al. |
| 2015/0364430 A1 | 12/2015 | Lin |
| 2016/0276237 A1 | 9/2016 | Lin et al. |
| 2016/0300804 A1 | 10/2016 | Omori |
| 2017/0053872 A1 | 2/2017 | Lee et al. |
| 2017/0098627 A1 | 4/2017 | Das et al. |
| 2017/0221840 A1 | 8/2017 | Paleari et al. |
| 2017/0221841 A1 | 8/2017 | Colpani et al. |
| 2018/0138076 A1 | 5/2018 | Yang et al. |
| 2020/0111674 A1 | 4/2020 | Sasahara et al. |

FOREIGN PATENT DOCUMENTS

| | | |
|---|---|---|
| DE | 10 2012 109 984 A1 | 4/2013 |
| JP | 63249346 A | 10/1988 |
| JP | 2009231681 A | 10/2009 |
| JP | 2013165099 A | 8/2013 |
| WO | 9852224 A1 | 11/1998 |

* cited by examiner

REDISTRIBUTION LAYER AND INTEGRATED CIRCUIT INCLUDING REDISTRIBUTION LAYER

BACKGROUND

Technical Field

The present disclosure relates to a method of manufacturing a redistribution layer, a redistribution layer and an integrated circuit including the redistribution layer.

Description of the Related Art

As is known, integrated circuits (ICs) are composed of several overlapping layers made of semiconducting, insulating and conductive materials, typically defined by photolithography.

In a first phase (front end of line, FEOL) of a manufacturing process of an integrated circuit, individual devices such as, among others, transistors, diodes, resistors and capacitors, are patterned in and on the surface of a wafer.

In a second phase (back end of line, BEOL), the individual devices are interconnected by conductive metal lines. In particular, due to the complexity of modern IC layouts and high density of individual devices, the back end of line process comprises manufacturing several stacked metal layers, electrically insulated from one another by dielectric layers; vias through the dielectric layers allow connecting any metal layer to the metal layers below and/or the one above.

In a third phase of the IC manufacturing process, a redistribution layer (RDL) is patterned above the last metal interconnection layer. As is known, the redistribution layer is an extra metal layer used for routing the input/output pads to other locations on the die area, enabling simpler chip-to-chip bonding.

FIG. 1 shows schematically a cross-section view of a portion of an IC 1 including a redistribution layer 2 according to the prior art. In particular, the IC 1 is represented in a system of spatial coordinates defined by three axes x, y, z, orthogonal to one another and the cross-section view is taken on an xz plane, defined by the x axis and the z axis. In the following, thicknesses, depths and heights are intended as measured along the z axis, and the meanings of "top" and "bottom", "above" and "below" are defined with reference to the direction of the z axis.

The IC 1 includes an interconnection layer 3, made of conductive material; the redistribution layer 2 includes a dielectric layer 4 extending above the interconnection layer 3 and a first passivation layer 6 extending above the dielectric layer 4.

The redistribution layer 2 further comprises a barrier region 8, extending above a top surface 6a of the first passivation layer 6 and across the whole depth of the first passivation layer 6 and of the dielectric layer 4, so as to be in contact with the interconnection layer 3.

The redistribution layer 2 further comprises a conductive region 10, extending on top of the barrier region 8. In particular, in a top view of the IC 1, the conductive region 10 is extending only inside the area defined by the barrier region 8. As a consequence, the conductive region 10 is not in contact with the first passivation layer 6.

Moreover, the thickness of the barrier region 8 is lower than the sum of the thicknesses of the dielectric layer 4 and of the first passivation layer 6. As a consequence, a part of the conductive region 10 extends below the top surface 6a of the first passivation layer 6. In other words, the barrier region 8 and the conductive region 10 form a via through the dielectric layer 4 and the first passivation layer 6, providing a conductive path from the interconnection layer 3 to the top surface 6a of the first passivation layer 6.

The redistribution layer 2 further comprises a first coating region 12, extending above the first passivation layer 6, around the conductive region 10 and the barrier region 8, and above the conductive region 10. The first coating region 12 is in contact with the top surface 6a of the first passivation layer 6, the conductive region 10 and the barrier region 8. In other words, the first coating region 12 completely covers the portions of the barrier region 8 and of the conductive region 10 extending above the top surface 6a of the first passivation layer 6.

The redistribution layer 2 further comprises a second coating region 14, extending above the first passivation layer 6, around the first coating region 12 and above the first coating region 12. The second coating region 14 is in contact with the first passivation layer 6 and the first coating region 12. In other words, the second coating region 14 completely covers the first coating region 12.

The redistribution layer 2 further comprises a second passivation layer 16 (e.g., polyimide, lead oxide (PbO), epoxy, etc.), extending above the first passivation layer 6 and around the second coating region 14.

In particular, a convenient choice of conductive materials for the redistribution layer 2 is such that the conductive region 10 is made of copper (Cu), the first coating region 12 is made of nickel (Ni) and the second coating region 14 is made of palladium (Pd).

In particular, the choice of nickel and palladium as a finishing stack on the conductive region 10 is due to its well-known advantages over aluminum as a bonding surface for copper wires, for instance in terms of bond window, shear strength, pad damage and reliability.

A known drawback of the redistribution layer 2 according to the prior art is due to an issue of the typically employed manufacturing method, which involves an electroless growth of nickel over copper, in order to form the first coating region 12 around and above the conductive region 10. Typically, at the end of this step, the first coating region 12 is not completely in contact with the top surface 6a of the first passivation layer 6, and a small gap of the order of few nanometers may exist between the first coating region 12 and the first passivation layer 6.

As a consequence, the nickel surface is not completely sealed, remaining exposed to environmental conditions. As is known, in presence of high temperature and high moisture rate, the nickel surface can be affected by corrosion processes. Moreover, it is known that high electric fields can lead to the formation of dendritic structures able to electromigrate and give rise to electrical shorts between two nickel lines, eventually leading to an IC failure.

BRIEF SUMMARY

An aim of the present disclosure is to provide a method of manufacturing a redistribution layer, a redistribution layer and an integrated circuit including the redistribution layer, to overcome the problems previously illustrated. In particular, one of the aims of the present disclosure is to completely seal the nickel surface in a copper redistribution layer with Ni/Pd finishing.

According to the present disclosure, a method of manufacturing a redistribution layer, a redistribution layer and an integrated circuit including the redistribution layer are provided.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 2:
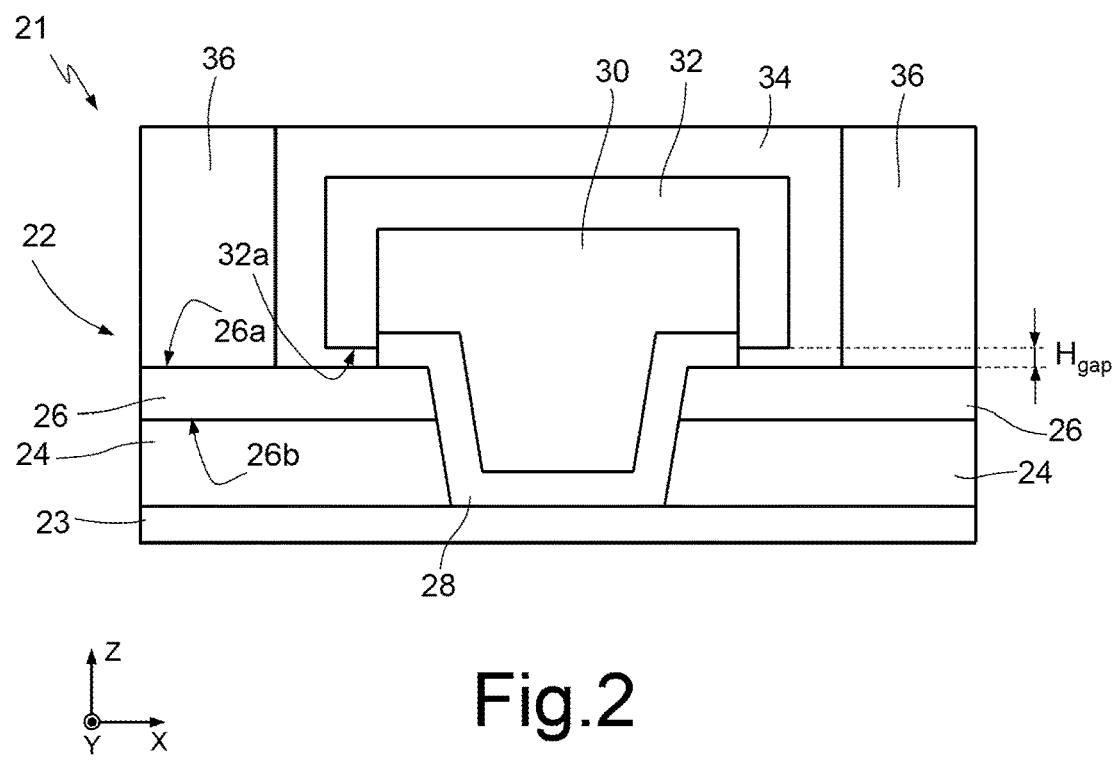
FIG. 2 is a cross-section view of a portion of an integrated circuit including a redistribution layer according to an embodiment of the present disclosure.

FIG. 2 shows schematically a cross-section view of a portion of an IC 21 including a redistribution layer 22 according to an embodiment of the present disclosure. In particular, the IC 21 of FIG. 2 is represented in a system of spatial coordinates defined by three axes x, y, z, orthogonal to one another and the cross-section view is taken on an xz plane, defined by the x axis and the z axis.

The IC 21 includes an interconnection layer 23, made of conductive material, such as aluminum or copper. In particular, the interconnection layer 23 is the last metal line of the BEOL of IC 21.

The redistribution layer 22 comprises a dielectric layer 24 extending above the interconnection layer 23 and a first passivation layer 26 extending above the dielectric layer 24. In the following, the term "insulating layer" refers to the stack composed of the dielectric layer 24 and the first passivation layer 26.

In particular, the dielectric layer 24 is made of an insulating material, such as silicon dioxide ($SiO_2$), and has thickness comprised for instance between 900 nm and 1200 nm.

In particular, the first passivation layer 26 is made of an insulating material, such as silicon nitride ($Si_3N_4$), and has thickness comprised for instance between 500 nm and 650 nm. The first passivation layer 26 is delimited by a top surface 26a and a bottom surface 26b, the bottom surface 26b being in contact with the dielectric layer 24.

The redistribution layer 22 further comprises a barrier region 28. A first portion of the barrier region 28 extends above the top surface 26a of the first passivation layer 26; a second portion of the barrier region 28, in contact with the first portion, extends below the top surface 26a of the first passivation layer 26, and across the whole depth of the first passivation layer 26 and of the dielectric layer 24, so as to be in contact with the interconnection layer 23.

The redistribution layer 22 further comprises a conductive region 30, extending on top of the barrier region 28. In particular, in a top view of the IC 21, not shown in the figures, the conductive region 30 is extending only inside the area defined by the barrier region 28. As a consequence, the conductive region 30 is not in contact with the first passivation layer 26. In the following, the term "conductive body" refers to the stack composed of the barrier region 28 and the conductive region 30.

Moreover, the thickness of the barrier region 28 is lower than the combined thickness of the dielectric layer 24 and the first passivation layer 26. As a consequence, a portion of the conductive region 30 extends below the top surface 26a of the first passivation layer 26. In other words, the barrier region 28 and the conductive region 30 form a via through the dielectric layer 24 and the first passivation layer 26, providing a conductive path from the interconnection layer 23 to the top surface 26a of the first passivation layer 26, extending further above the top surface 26a of the first passivation layer 26.

In particular, the barrier region 28 is made of conductive material, such as titanium (Ti), or titanium-tungsten (TiW), or titanium nitride (TiN), and has thickness comprised for instance between 270 nm and 330 nm.

In particular, the conductive region 30 is made of conductive material, such as copper (Cu), and has thickness comprised for instance between 8 μm and 12 μm.

The redistribution layer 22 further comprises a first coating region 32, extending above the conductive region 30 and around the conductive region 30, in correspondence of sidewalls of the portion of the conductive region 30 above the top surface 26a of the first passivation layer 26.

In particular, the first coating region 32 is made of conductive material, such as nickel (Ni), and has thickness comprised for instance between 1 μm and 1.8 μm.

According to an aspect of the present disclosure, the first coating region 32 is not in contact with the first passivation layer 26. In particular, the portion of the first coating region 32 extending around the sidewalls of the conductive region 30 has a surface 32a directly facing the top surface 26a of the first passivation layer 26 and substantially parallel to the top surface 26a of the first passivation layer 26, at a distance $H_{gap}$ from the top surface 26a of the first passivation layer 26, said distance being comprised for instance between 10 nm and 50 nm (in particular, 25 nm) when measured along the z axis.

The redistribution layer 22 further comprises a second coating region 34, extending above the first passivation layer 26, around the first coating region 32 and above the first coating region 32. The second coating region 34 is in contact with the first passivation layer 26 and the first coating region 32. In other words, the second coating region 34 completely covers the first coating region 32.

In particular, the second coating region 34 is made of conductive material, such as palladium (Pd), and has thickness comprised for instance between 0.2 μm and 0.5 μm.

Figure 1:
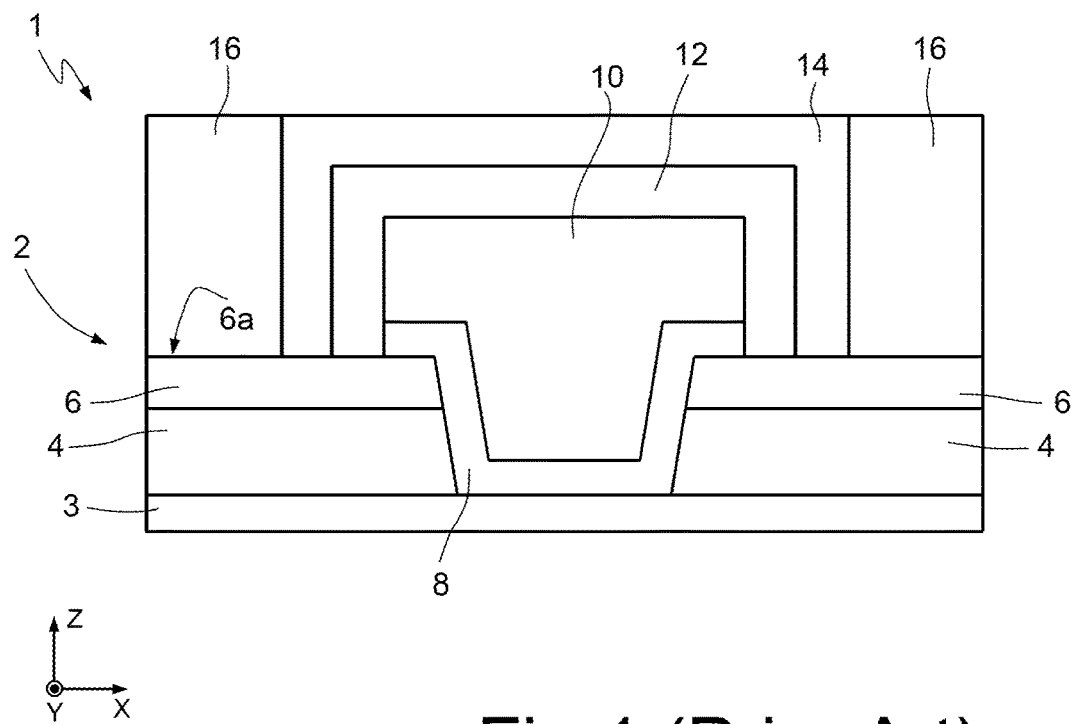
FIG. 1 is a cross-section view of a portion of an integrated circuit including a redistribution layer according to the prior art.

According to an aspect of the present disclosure, the second coating region 34 extends between the first passivation layer 26 and the first coating region 32, filling a gap having height $H_{gap}$ between the first passivation region 26 and the first coating region 32. In other words, the second coating region 34 completely seals the first coating region 32. As a consequence, differently from the case of the redistribution layer 2 of FIG. 1 according to the prior art, the first coating region 32 is not exposed to environmental conditions, preventing the risk of corrosions. Therefore, the redistribution layer 22 of FIG. 2 according to the present embodiment has an improved reliability with respect to the prior art, especially in conditions of high temperature and high moisture rate.

The redistribution layer 22 further comprises a second passivation layer 36, extending above the first passivation layer 26 and around the second coating region 34. In particular, the second passivation layer 36 is made of an insulating material, such as polyimide, PbO, epoxy, etc.

Figure 3:
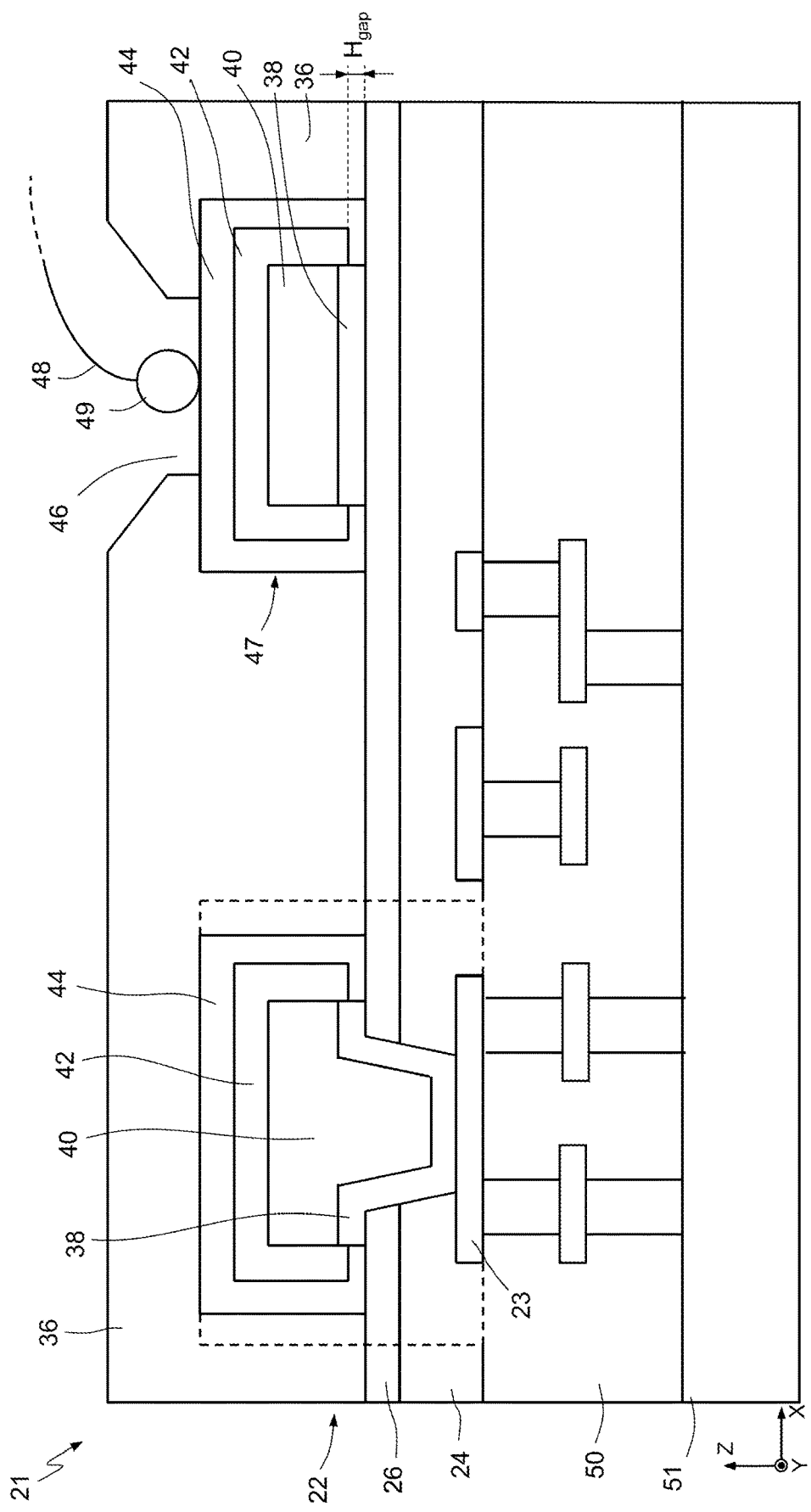
FIG. 3 is a cross-section view of another portion of the integrated circuit of FIG. 2, including the portion of FIG. 2.

FIG. 3 shows schematically a cross-section view of another portion of the IC 21, including the portion of FIG. 2, corresponding to the area inside the dashed lines in FIG. 3. Elements already shown in the view of FIG. 2 are designated by the same reference numerals and are not further described.

FIG. 3 shows that the barrier region 28, the conductive region 30, the first coating region 32, and the second coating region 34 are respectively part of a barrier layer 38, a conductive layer 40, a first coating layer 42 and a second coating layer 44. The second passivation layer 36 extends above the second coating layer 44. Moreover, the second passivation layer 36 may include an opening 46 that partially exposes a contact 47, in order to allow a wire bonding by means of a wire 48, for instance made of copper. The contact 47 is formed by contact portions of the barrier layer 38, conductive layer 40, first coating layer 42, and second coating layer 44, and the wire 48 is connected to the contact portion of the second coating layer 44 by a conductive bond 49.

As is clear from FIG. 3, depending on the routing layout of the interconnection layers and the redistribution layer 22 of the IC 21, a cross-section of the IC 21 may include areas wherein the barrier layer 38 and the conductive layer 40 do not form a via through the first passivation layer 26 and the dielectric layer 24 to reach the interconnection layer 23. In any case, there is always a gap having height $H_{gap}$ between the first coating layer 42 and the first passivation layer 26, said gap being filled by the second coating layer 44.

Moreover, the IC 21 comprises further metal interconnection layers, insulating layers and vias formed in the BEOL extending below the interconnection layer 23 and collectively designated with the reference numeral 50. In addition, the IC 21 includes a semiconductor substrate 51 in which are formed circuit elements, such as transistors, diodes, resistors and capacitors.

FIGS. 4A-4I show schematically a cross-section view of steps of a method of manufacturing a redistribution layer according to an embodiment of the present disclosure; in particular, the method of FIGS. 4A-4I is a method of manufacturing the redistribution layer 22 of FIG. 2. The redistribution layer is represented in a system of spatial coordinates defined by three axes x, y, z, orthogonal to one another and the cross-section view is taken on an xz plane, defined by the x axis and the z axis.

Figure 4A:
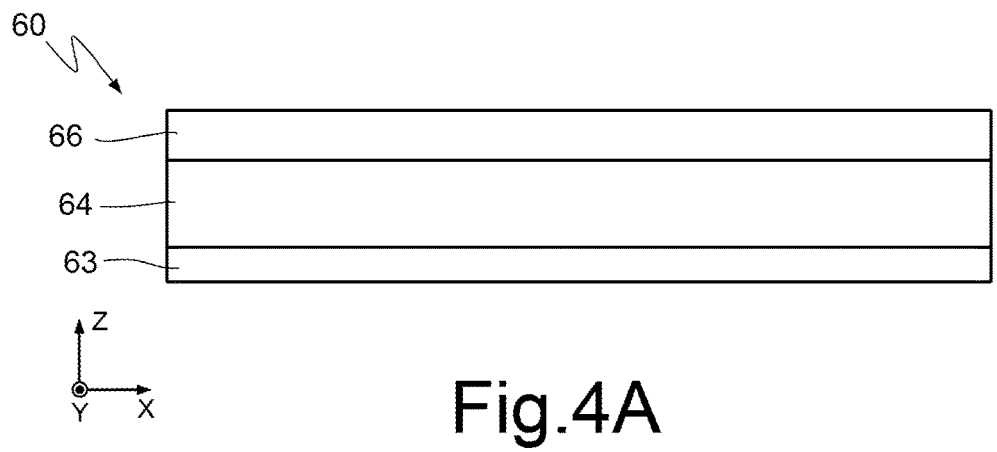
FIGS. 4A-4I are cross-section views of respective steps of a manufacturing method of the redistribution layer of FIG. 2.

With reference to FIG. 4A, there is provided a wafer 60, including an interconnection layer 63. In particular, the interconnection layer 63 is the outermost metallization layer of the back end of line of an integrated circuit. The lower layers of the integrated circuit, such as the other metallization layers 50 and the semiconductor substrate 51 of the wafer 60, are not shown in FIGS. 4A-4I.

A dielectric layer 64 is formed above the interconnection layer 63. In particular, the dielectric layer 64 is made of an insulating material, such as silicon dioxide ($SiO_2$), and has thickness comprised for instance between 900 nm and 1200 nm.

A first passivation layer 66 is formed above the dielectric layer 64. In particular, the first passivation layer 66 is made of an insulating material, such as silicon nitride ($Si_3N_4$), and has thickness comprised for instance between 500 nm and 650 nm. In the following, the term "insulating layer" refers to the stack composed of the dielectric layer 64 and the first passivation layer 66.

Figure 4B:
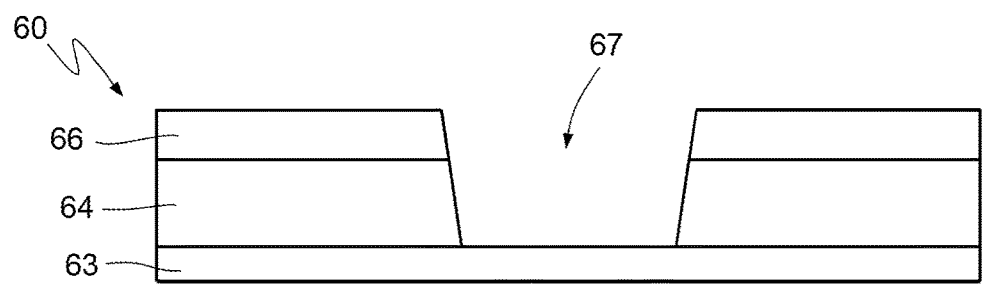

Then, FIG. 4B, a trench 67 is formed through the first passivation layer 66 and the dielectric layer 64, up to exposing a surface of the interconnection layer 63. For instance, the trench 67 is formed by convenient photolithography and dry etching steps of a known type, applied in correspondence of the exposed surface of the first passivation layer 66.

Figure 4C:
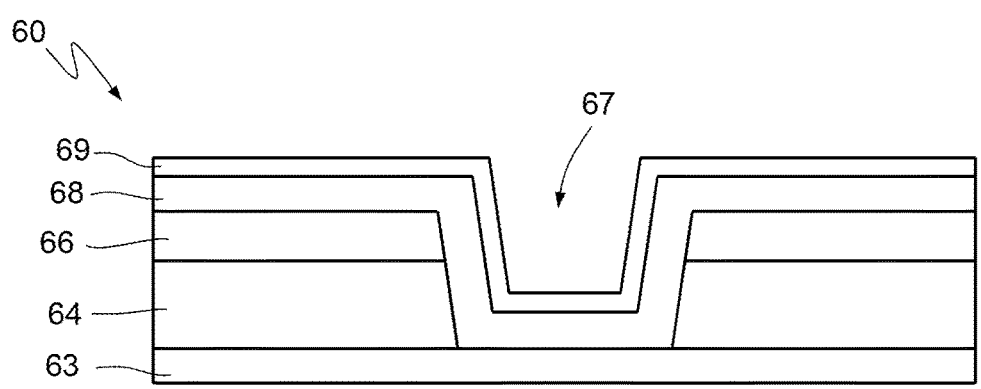

Then, FIG. 4C, a barrier layer 68 is formed above the first passivation layer 66, for instance by physical vapor deposition (PVD). The barrier layer 68 partially fills the trench 67, covering the previously exposed sidewalls of the dielectric layer 64 and the first passivation layer 66 and the previously exposed surface of the interconnection layer 63.

In particular, the barrier layer 68 is made of conductive material, such as titanium (Ti), or titanium-tungsten (TiW), or titanium nitride (TiN). Moreover, the thickness of the barrier layer 68 is lower than the combined thickness of the dielectric layer 64 and the first passivation layer 66, and in particular is comprised for instance between 270 nm and 330 nm. Then, a seed layer 69 is formed above the barrier layer 68, partially filling the trench 67. For instance, the seed layer 69 is deposited by PVD.

In particular, the seed layer 69 is made of conductive material, such as copper (Cu), and has thickness comprised for instance between 180 nm and 220 nm, such that the trench 67 is only partially filled by the seed layer 69.

Figure 4D:
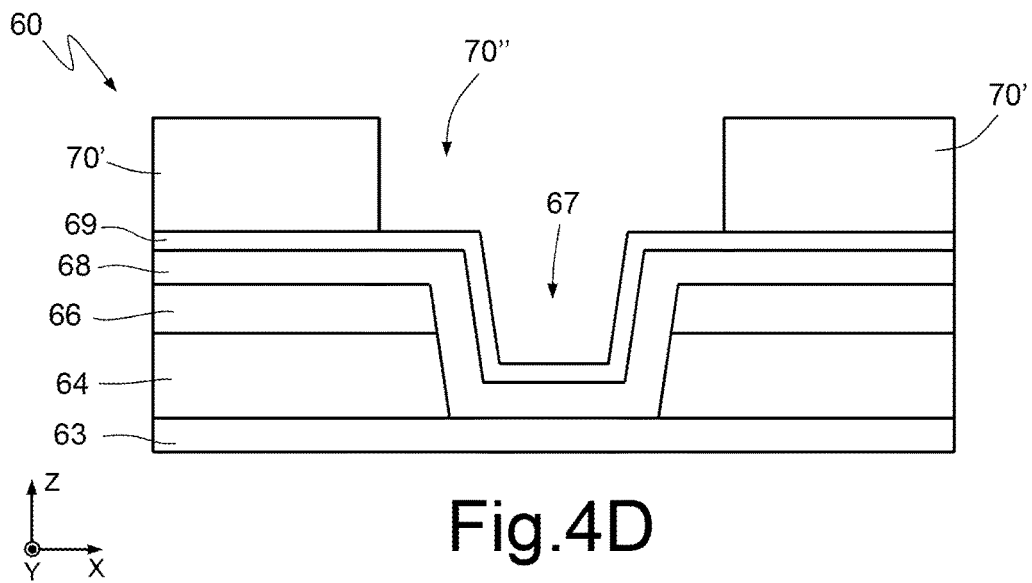

Then, FIG. 4D, a photolithography mask 70' is applied at the exposed surface of the seed layer 69. In particular, the layout of the photolithography mask 70' is designed considering that openings in the mask define areas in which a layer will be formed in a following step of the manufacturing method.

In particular, FIG. 4D shows an opening 70" of the photolithography mask 70', the opening 70" being centered on the partially filled trench 67 so that the trench 67 is not covered by the photolithography mask 70'.

Figure 4E:
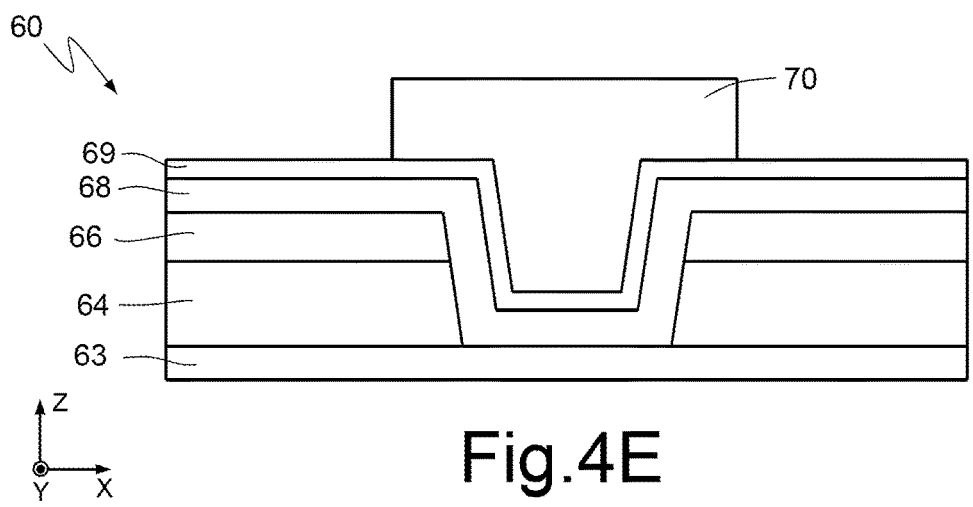

Then, FIG. 4E, a conductive layer 70 is formed above the portions of the seed layer 69 not covered by the photolithography mask 70'. The thickness of the conductive layer 70 is high enough to completely fill the trench 67 and partially fill the opening 70" of the photolithography mask 70'.

In particular, the conductive layer 70 is made of the same conductive material of the seed layer 69, such as copper (Cu), and has thickness comprised for instance between 8 μm and 12 μm.

In particular, the conductive layer 70 is formed by electrodeposition. Then, the photolithography mask 70' is removed by a wet removal process, exposing portions of the seed layer 69 not covered by the conductive layer 70.

Figure 4F:
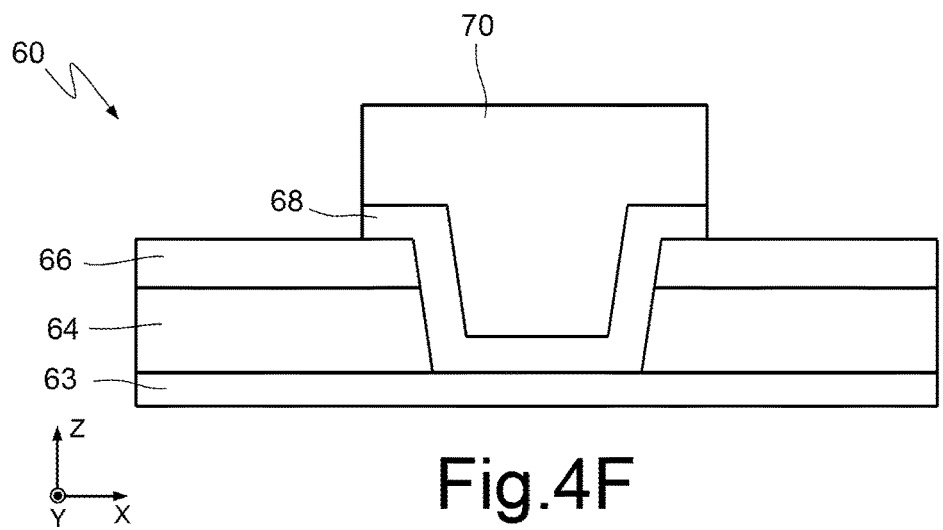

Then, FIG. 4F, said exposed portions of the seed layer 69, not covered by the conductive layer 70, are removed, for instance by wet etching, up to exposing the portions of the barrier layer 68 underneath them. Thus, the remaining portions of the seed layer 69, covered by the conductive layer 70, form, together with the conductive layer 70, the conductive region 30 of the redistribution layer 22 of FIG. 2.

Then, the exposed portions of the barrier layer 68 are removed, for instance by wet etching, up to exposing the portions of the first passivation layer 66 underneath, without affecting the portions of the barrier layer 68 below the conductive layer 70, for instance by employing standard photolithography techniques. As a consequence, the barrier region 28 of the redistribution layer 22 of FIG. 2 is formed.

Figure 4G:
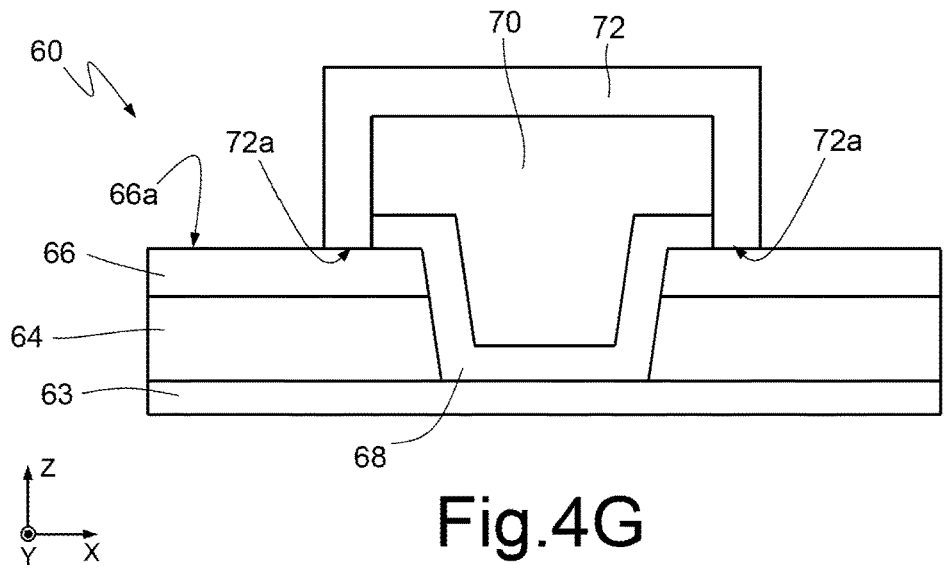

Then, FIG. 4G, a first coating layer 72 is formed by electroless deposition, in correspondence of the exposed surfaces of the barrier layer 68 and the conductive layer 70. Thus, the first coating layer 72 completely covers the conductive layer 70 and the barrier layer 68, and is in contact with the partially exposed surface of the first passivation layer 66, designated with the reference numeral 66a. In particular, the first coating layer 72 is in contact with the exposed surface 66a of the first passivation layer 66 in correspondence of a bottom surface 72a of the first coating layer 72.

In particular, the first coating layer 72 is made of conductive material, such as nickel (Ni), and has thickness comprised for instance between 1 μm and 1.8 μm.

Figure 4H:
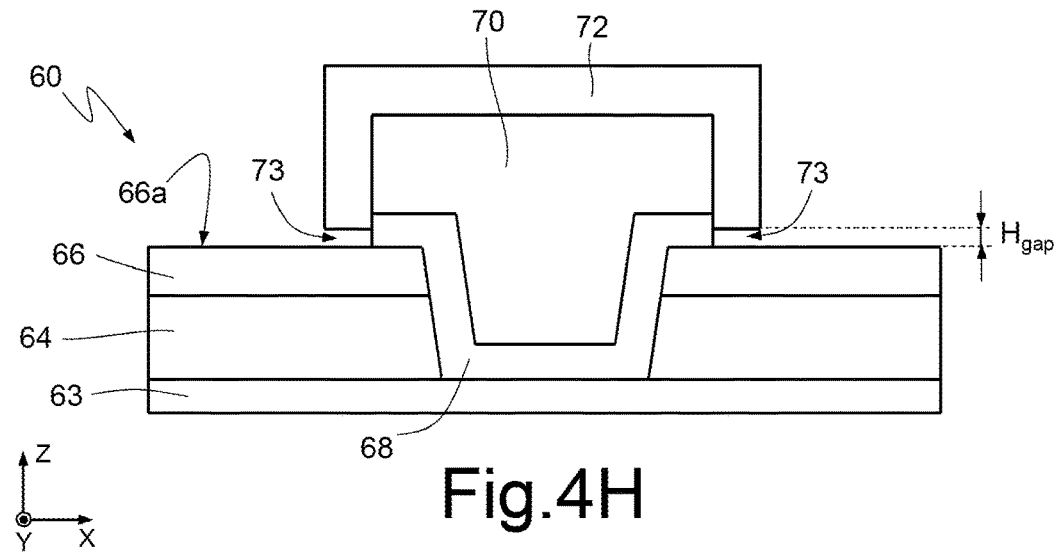

Then, FIG. 4H, a thermal treatment is applied to the wafer 60 in order to create a gap 73 between said surface 66a of the first passivation layer 66 and the bottom surface of the first coating layer 72. In particular, the gap 73 has the height $H_{gap}$ in the range 10-50 nm.

According to an aspect of the present disclosure, the thermal treatment comprises a first step of increasing the temperature of the wafer 60 from room temperature to a high temperature. Room temperature is comprised for instance between 20° C. and 25° C.; the high temperature is comprised for instance between 245° C. and 255° C. In particular, the increase in temperature occurs during a first time interval, comprised for instance between 10 s and 60 s.

Then, in a second step, following the first step of the thermal treatment, the wafer is kept at the high temperature for a second time interval comprised for instance between 30 s and 180 s.

Then, in a third step, following the second step of the thermal treatment, the temperature of the wafer 60 is decreased from the high temperature to room temperature over a third time interval, for example, lasting no more than 180 s.

In particular, while applying the thermal treatment, the wafer 60 is kept in a nitrogen ($N_2$) atmosphere at a pressure comprised between 1.0 and 5.0 Torr.

The Applicant verified that by applying to the wafer 60 the thermal treatment described above, some mechanical properties of the barrier layer 68, of the conductive layer 70 and of the first coating layer 72 can be conveniently modified. In particular, the coefficient of thermal expansion and the Young modulus are modified with the thermal treatment, and the residual stress of said layers is modified, resulting, at the end of the thermal treatment, in the formation of the gap 73.

Figure 4I:
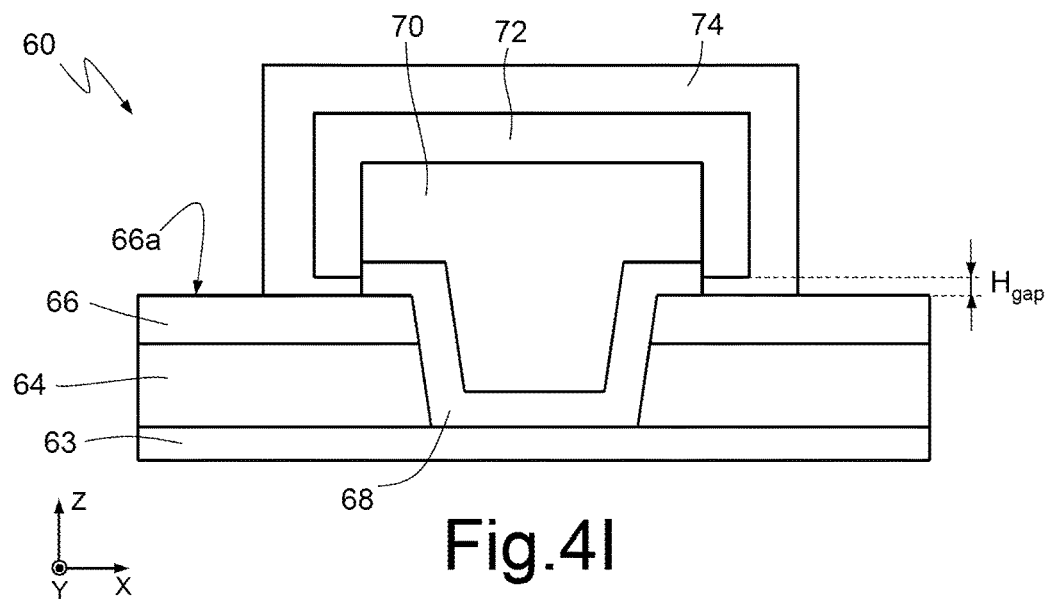

Then, FIG. 4I, a second coating layer 74 is formed by electroless deposition, in correspondence of the exposed surfaces of the first coating layer 72. In particular, the second coating layer 74 grows starting from the first coating layer 72, extending above the first coating layer 72, around the sidewalls of the first coating layer 72, and inside the gap between the first coating layer 72 and the surface 66a of the first passivation layer 66. Thus, the second coating layer 74 completely seals the first coating layer 72 and the barrier layer 68, and is in contact with the surface 66a of the first passivation layer 66. As a consequence, the first coating layer 72 is not exposed to the environment.

In particular, the second coating layer 74 is made of conductive material, such as palladium (Pd), and has thickness comprised for instance between 0.2 μm and 0.5 μm.

Then, a second passivation layer is formed above the first passivation layer 26 and around the second coating region 94. In particular, the second passivation layer is made of an insulating material, such as polyimide. Thus, the redistribution layer 22 of FIG. 2 is obtained.

The Applicant verified that a possible issue of the redistribution layer 22 of FIG. 2 consists in the risk of forming cracks in the first passivation layer 26 after applying the thermal treatment to the wafer 60, depending on the mechanical properties of the material used for the first passivation layer 26.

Figure 5:
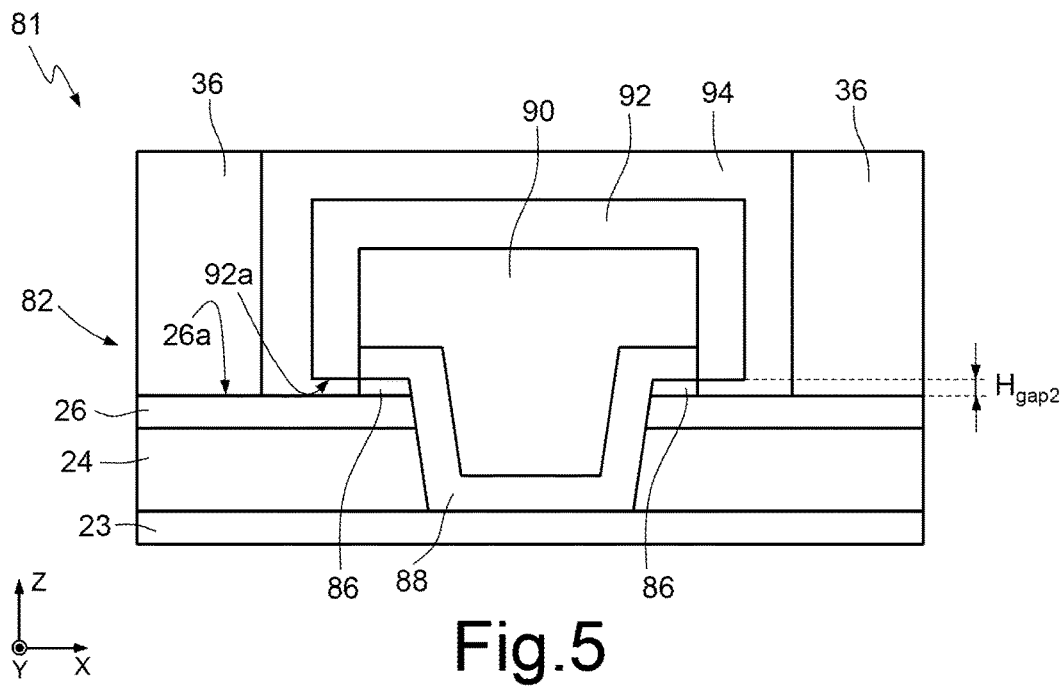
FIG. 5 is a cross-section view of a portion of an integrated circuit including a redistribution layer according to another embodiment of the present disclosure.

FIG. 5 shows schematically a cross-section view of a portion of an IC 81 including a redistribution layer 82 according to another embodiment of the present disclosure; elements in common with the IC 21 and the redistribution layer 22 of FIG. 2 are designated by the same reference numerals and not further described.

The redistribution layer 82 differs from the redistribution layer 22 of FIG. 2 for the presence of spacers 86. In particular, the redistribution layer 82 comprises spacers 86 extending above and in contact with the top surface 26a of the first passivation layer 26.

In particular, the spacers 86 are of insulating material, such as silicon dioxide ($SiO_2$) or silicon nitride ($Si_3N_4$), and have a thickness $H_{gap2}$ comprised for instance between 10 nm and 100 nm (in particular, 25 nm).

The redistribution layer 82 further comprises a barrier region 88, extending above the spacers 86 and across the whole depth of the first passivation layer 26 and of the dielectric layer 24, so as to be in contact with the interconnection layer 23.

The redistribution layer 82 further comprises a conductive region 90, extending on top of the barrier region 88. In particular, in a top view of the IC 81, not shown in the figures, the conductive region 90 is extending only inside the area defined by the barrier region 88. As a consequence, the conductive region 90 is not in contact with the first passivation layer 26. In the following, the term "conductive body" refers to the stack composed of the barrier region 88 and the conductive region 90.

Moreover, the thickness of the barrier region 88 is lower than the combined thickness of the dielectric layer 24 and of the first passivation layer 26. As a consequence, a part of the conductive region 90 extends below the top surface 26a of the first passivation layer 26. In other words, the barrier region 88 and the conductive region 90 form a via through the dielectric layer 24 and the first passivation layer 26, providing a conductive path from the interconnection layer 23 to the top surface 26a of the first passivation layer 26.

In particular, the barrier region 88 is made of conductive material, such as titanium (Ti), or titanium-tungsten (TiW), or titanium nitride (TiN), and has thickness comprised for instance between 270 nm and 330 nm.

In particular, the conductive region 90 is made of conductive material, such as copper (Cu), and has thickness comprised for instance between 8 μm and 12 μm.

The redistribution layer 82 further comprises a first coating region 92, extending above the conductive region 90 and around the conductive region 90, in correspondence of sidewalls of the portion of the conductive region 90 above the top surface 26a of the first passivation layer 26. In other words, the first coating region 92 covers the surface of the conductive region 90 not already covered by the barrier region 88.

In particular, the first coating region 92 is made of conductive material, such as nickel (Ni), and has thickness comprised for instance between 1 μm and 1.8 μm.

According to an aspect of the present disclosure, the first coating region 92 is not in contact with the first passivation layer 26. In particular, the portion of the first coating region 92 extending around the sidewalls of the conductive region 90 has a surface 92a directly facing the top surface 26a of the first passivation layer 26 and substantially parallel to the top surface 26a of the first passivation layer 26, at a distance $H_{gap2}$ from the top surface 26a of the first passivation layer 26 being equivalent to the height $H_{gap2}$ of the spacers 86, said distance $H_{gap2}$ being measured along the z axis.

The redistribution layer 22 further comprises a second coating region 94, extending above the first passivation layer 26, around the first coating region 92 and above the first coating region 92. The second coating region 94 is in contact with the first passivation layer 26 and the first coating region 92. In other words, the second coating region 94 completely covers the first coating region 92.

In particular, the second coating region 94 is made of conductive material, such as palladium (Pd), and has thickness comprised for instance between 0.2 μm and 0.5 μm.

According to an aspect of the present disclosure, the second coating region 94 extends between the first passivation layer 26 and the first coating region 92, filling a gap between the first passivation region 26 and the first coating region 92. In other words, the second coating region 94 completely seals the first coating region 92. As a consequence, as in the case of the redistribution layer 22 of FIG. 2, the first coating region 92 is not exposed to environmental conditions, thus preventing the risk of corrosions. Therefore, the redistribution layer 82 according to the present embodiment has an improved reliability with respect to the prior art, especially in conditions of high temperature and high moisture rate.

FIGS. 6A-6F show schematically a cross-section view of steps of a method of manufacturing a redistribution layer according to an embodiment of the present disclosure; in particular, the method of FIGS. 6A-6F is a method of manufacturing the redistribution layer 82 of FIG. 5. The redistribution layer is represented in a system of spatial coordinates defined by three axes x, y, z, orthogonal to one another and the cross-section view is taken on an xz plane, defined by the x axis and the z axis.

Figure 6A:
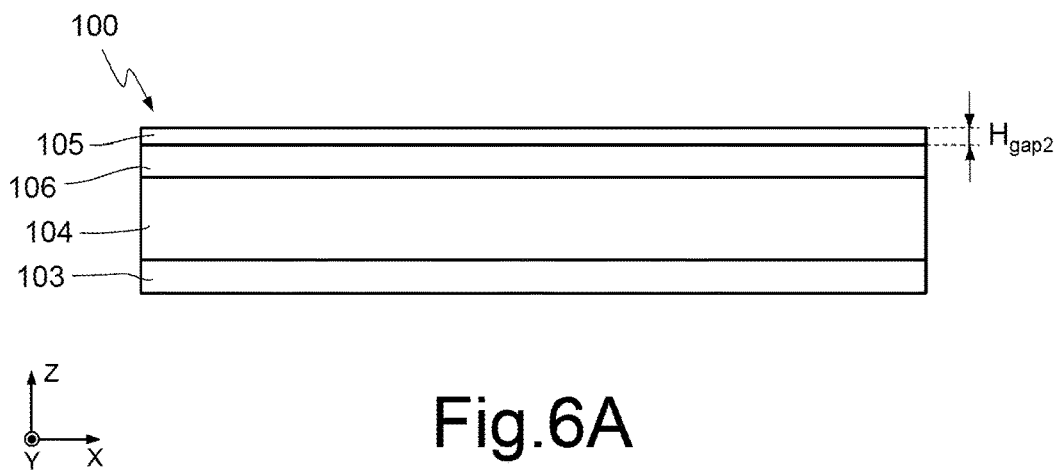
FIGS. 6A-6F are cross-section views of respective steps of a manufacturing method of the redistribution layer of FIG. 5.

With reference to FIG. 6A, there is provided a wafer 100, including an interconnection layer 103. In particular, the interconnection layer 103 is the outermost metallization layer of the back end of line of an integrated circuit. The lower layers of the integrated circuit are not shown in FIGS. 6A-6F.

A dielectric layer 104 is formed above the interconnection layer 103. In particular, the dielectric layer 104 is made of an insulating material, such as silicon dioxide ($SiO_2$), and has thickness comprised for instance between 900 nm and 1200 nm.

A first passivation layer 106 is formed above the dielectric layer 104. In particular, the first passivation layer 106 is made of an insulating material, such as silicon nitride ($Si_3N_4$), and has thickness comprised for instance between 500 nm and 650 nm. In the following, it will be used the term "insulating layer" to refer to the stack composed of the dielectric layer 104 and the first passivation layer 106.

A spacing layer 105 is formed above the first passivation layer 106. In particular, the spacing layer 105 is made of an insulating material, such as silicon dioxide ($SiO_2$) or silicon nitride ($Si_3N_4$).

According to an aspect of the present disclosure, the spacing layer 105 is employed as a sacrificial layer, being partially etched in a following step of the method of manufacturing. For this reason, preferably, the spacing layer 105 has a high selectivity in terms of etching with respect to the first passivation layer 106. As a consequence, the choice of the material employed for the spacing layer 105 depends on the material employed for the first passivation layer 106. For instance, if the first passivation layer 106 is made of $Si_3N_4$, the spacing layer 105 is preferably made of $SiO_2$ or of a high etch-rate $Si_3N_4$. As is known, a higher etch-rate $Si_3N_4$ can be obtained by depositing the spacing layer 105 at a lower temperature than the one employed for depositing the first passivation layer 104. In particular, the spacing layer 105 has the thickness $H_{gap2}$.

Figure 6B:
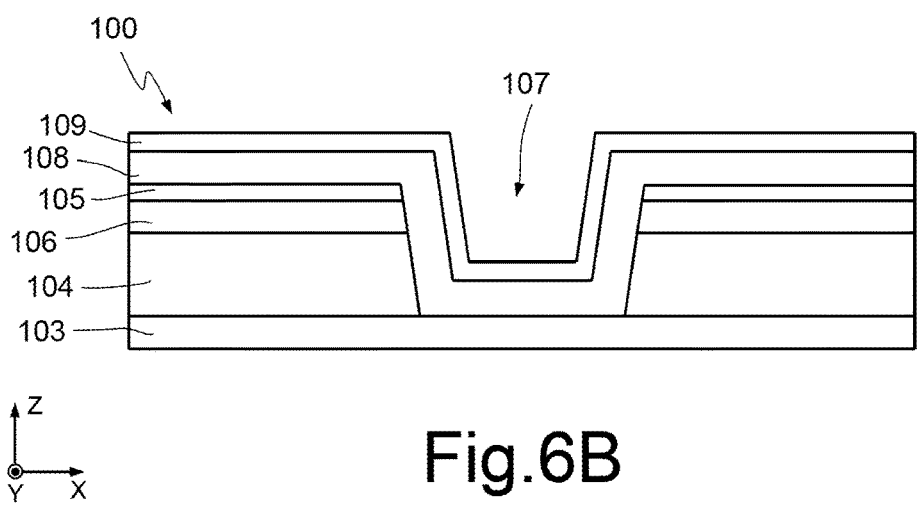

Then, FIG. 6B, a trench 107 is formed through the dielectric layer 104 and the first passivation layer 106, up to exposing a surface of the interconnection layer 103. For instance, the trench 107 is formed by convenient photolithography and dry etching steps of a known type, in correspondence of the exposed surface of the spacing layer 105.

Then, a barrier layer 108 is formed above the spacing layer 105, for instance by PVD. The barrier layer 108 partially fills the trench 107, covering the previously exposed sidewalls of the spacing layer 105, of the first passivation layer 106 and of the dielectric layer 104, and covering the previously exposed surface of the interconnection layer 103.

In particular, the barrier layer 108 is made of conductive material, such as titanium (Ti), titanium-tungsten (TiW), or titanium nitride TiN). Moreover, the thickness of the barrier layer 108 is lower than the combined thickness of the dielectric layer 104, the first passivation layer 106 and the spacing layer 105, and in particular is comprised for instance between 270 nm and 330 nm. Then, a seed layer 109 is formed above the barrier layer 108, partially filling the trench 107. For instance, the seed layer 109 is deposited by PVD.

In particular, the seed layer 109 is made of conductive material, such as copper (Cu), and has thickness comprised for instance between 180 nm and 220 nm, such that the trench 107 is only partially filled by the seed layer 109.

Then, a photolithography mask (not shown in the figures) is applied at the exposed surface of the seed layer 109. In particular, the layout of the photolithography mask is designed considering that openings in the mask define areas in which a layer will be formed in a following step of the manufacturing method.

In particular, the photolithography mask presents an opening in correspondence of the partially filled trench 107.

Figure 6C:
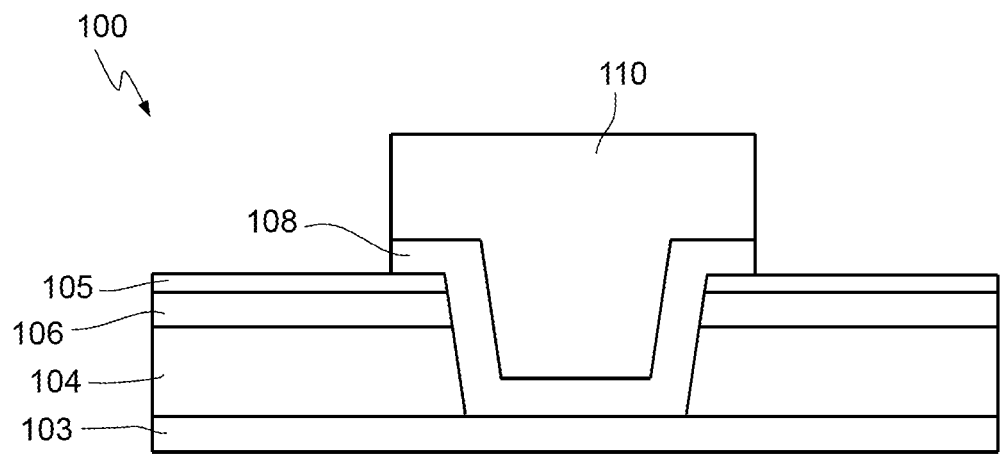

Then, FIG. 6C, a conductive layer 110 is formed above the portions of the seed layer 109 not covered by the photolithography mask. In particular, the thickness of the conductive layer 110 is high enough to completely fill the trench 107.

In particular, the conductive layer 110 is made of the same conductive material of the seed layer 109, such as copper (Cu), and has thickness comprised for instance between 8 μm and 12 μm.

In particular, the conductive layer 110 is formed by electrodeposition. Then, the photolithography mask is removed by a wet removal process, exposing portions of the seed layer 109 not covered by the conductive layer 110.

Then, said exposed portions of the seed layer 109, not covered by the conductive layer 110, are removed, for instance by wet etching, up to exposing the portions of the barrier layer 108 underneath. Thus, the remaining portions of the seed layer 109, covered by the conductive layer 110, form, together with the conductive layer 110, the conductive region 90 of the redistribution layer 82 of FIG. 5.

Then, the exposed portions of the barrier layer 108 are removed, for instance by wet etching, up to exposing the portions of the spacing layer 105 underneath, without affecting the portions of the barrier layer 108 below the conductive layer 110. As a consequence, the barrier region 88 of the redistribution layer 82 of FIG. 5 is formed.

Figure 6D:
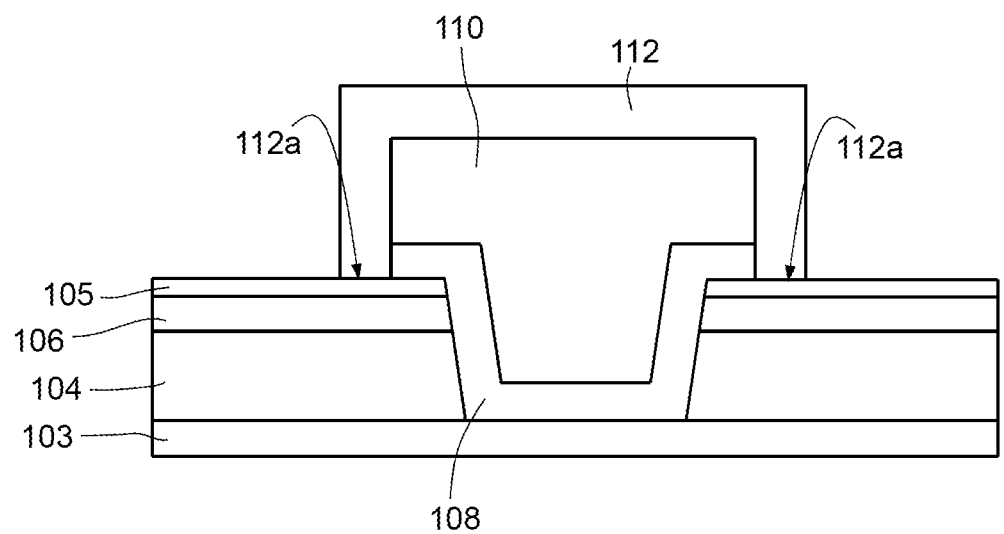

Then, FIG. 6D, a first coating layer 112 is formed by electroless deposition, in correspondence of the exposed surfaces of the barrier layer 108 and the conductive layer 110. Thus, the first coating layer 112 completely covers the conductive layer 110 and the barrier layer 108, and is in contact with the partially exposed surface of the spacing layer 105. In particular, the first coating layer 112 is in contact with the spacing layer 105 in correspondence of a bottom surface 112a of the first coating layer 112.

In particular, the first coating layer 112 is made of conductive material, such as nickel (Ni), and has thickness comprised for instance between 1 µm and 1.8 µm.

Figure 6E:
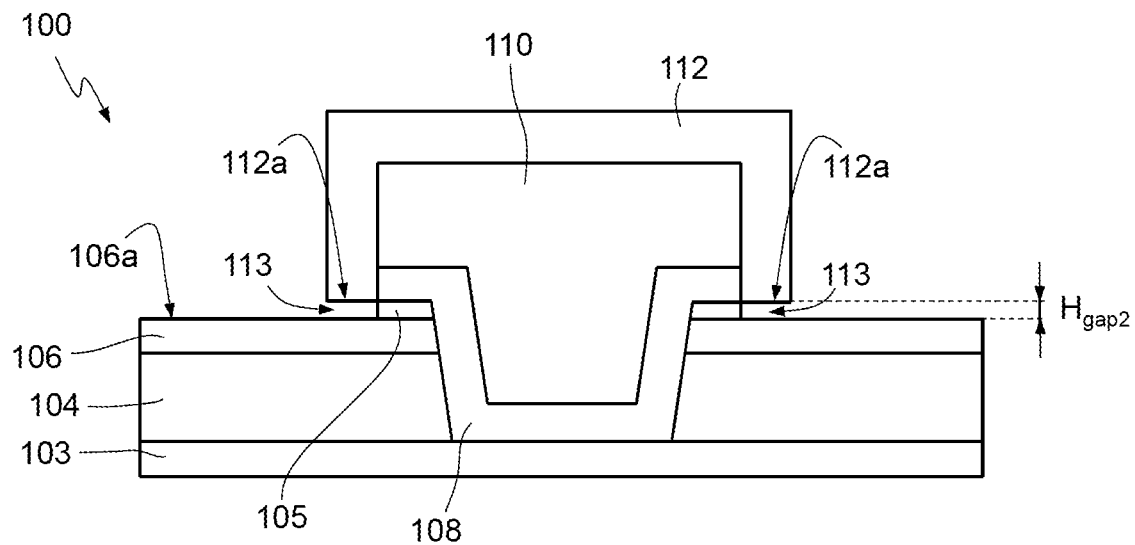

Then, FIG. 6E, the spacing layer 105 is partially etched in order to create a gap 113 between a top surface 106a of the first passivation layer 106 and the first coating region 112, the top surface 106a being in contact with remaining portions of the spacing layer 105. In particular, the gap 113 has the height $H_{gap2}$ in the range 10-100 nm.

In particular, the spacing layer 105 is etched by wet etching, using chemicals that remove the spacing layer 105 selectively with respect to the first coating layer 112, the barrier layer 108 and the first passivation layer 106.

For instance, the wafer 100 can be immersed in a hydrofluoric (HF) acid bath on in a buffered hydrofluoric (BHF) batch if the spacing layer 105 is made of silicon dioxide or a high etch rate silicon nitride, so that the spacing layer 105 is etched at a faster rate than the surrounding layers.

In particular, the etching step proceeds at least until the gap 113 is completely formed, so that the remaining portions of the spacing layer 105 do not extend between the first passivation layer 106 and the first coating layer 112. In other words, at the end of the etching step of FIG. 6E, the bottom surface 112a of the first coating layer 112, directly facing the top surface 106a of the first passivation layer 106, is not in direct contact with the spacing layer 105.

Figure 6F:
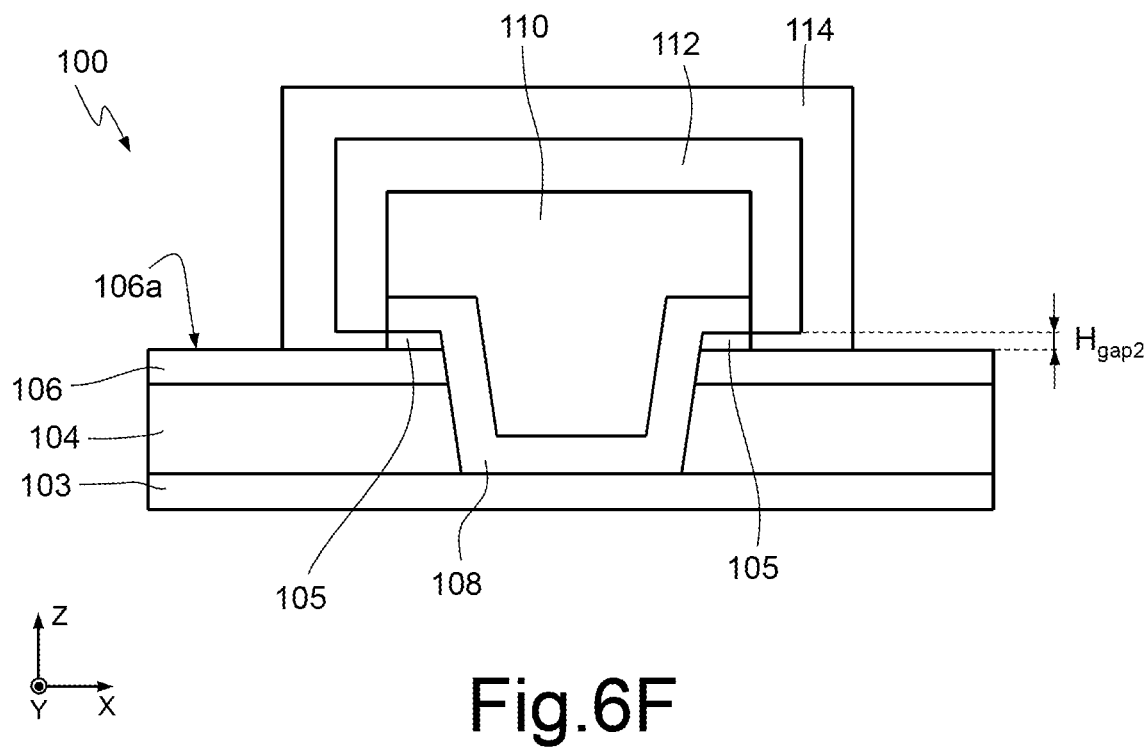

Then, FIG. 6F, a second coating layer 114 is formed by electroless deposition, in correspondence of the exposed surfaces of the first coating layer 112. In particular, the second coating layer 114 grows starting from said surfaces of the first coating layer 112, extending above the first coating layer 112, around the sidewalls of the first coating layer 112, and inside the gap between the first coating layer 112 and the top surface 106a of the first passivation layer 106. Thus, the second coating layer 114 completely seals the first coating layer 112, and is in contact with the top surface 106a of the first passivation layer 106. As a consequence, the first coating layer 112 is not exposed to the environment.

In particular, the second coating layer 114 is made of conductive material, such as palladium (Pd), and has thickness comprised for instance between 0.2 µm and 0.5 µm.

Then, a second passivation layer is formed above the first passivation layer 106 and around the second coating region 114. In particular, the second passivation layer is made of an insulating material, such as polyimide. Thus, the redistribution layer 82 of FIG. 5 is obtained.

The advantages of the disclosure described previously, according to the various embodiments, emerge clearly from the foregoing description.

In particular, since the first coating region is completely sealed by the second coating region, it is possible to use materials for the first coating region that are subject to corrosion when exposed to the environment, without compromising the reliability of the redistribution layer.

The full sealing of the conductive material can also improve the electromigration performances of the device.

Finally, it is clear that modifications and variations may be made to what has been described and illustrated herein, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
 a redistribution layer that includes:
  an insulating layer having a top surface;
  a conductive body extending on a top surface of the insulating layer, the conductive body including a barrier region having a second surface spaced apart from a first surface and a sidewall surface transverse to the first surface, the barrier region extending into the insulating layer;
  a first coating region extending around and above the conductive body, in contact with the conductive body and spaced apart from the top surface of the insulating layer; and
  a second coating region extending around and above the first coating region, and extending between the first coating region and the insulating layer, in contact with the first coating region and with the conductive body, completely sealing the first coating region from the insulating layer; and
  a spacer that includes an end sidewall surface, the spacer is in contact with the first surface of the insulating layer, is in contact with the second surface of the barrier region, is in contact with the sidewall surface of the barrier region, and is in contact with the second coating region, the spacer is between the first surface of the insulating layer and the second surface of the barrier region, and the end sidewall surface of the spacer is in contact with and covered by the second coating region.

2. The integrated circuit according to claim 1, wherein a portion of the first coating region extending around sidewalls of the conductive body has a surface directly facing the top surface of the insulating layer, at a distance from the top surface of the insulating layer being comprised between 10 nm and 50 nm.

3. The integrated circuit according to claim 1, wherein:
 the conductive body has a conductive region on the barrier region, the conductive region is made of copper;
 the first coating region is made of nicker and
 the second coating region is made of palladium.

4. The integrated circuit according to claim 1, further comprising an interconnection layer extending below the insulating layer, wherein the barrier region of the conductive body extends completely through the insulating layer and contacts the interconnection layer.

5. The device of claim 1 further comprising another insulating layer on the insulating layer and covering one or more respective sidewalls of the second coating region.

6. An integrated circuit, comprising:
 a redistribution layer that includes:

an insulating layer having a first surface;
one or more spacers extending above the first surface of the insulating layer;
a conductive body including:
a barrier region extending above the one or more spacers and in contact with the one or more spacers, the barrier region including a first portion spaced apart from the insulating layer and a second portion transverse to the first portion and extending into the insulating layer, the first portion having a second surface facing the insulating layer and the second portion having a sidewall surface transverse to the first surface, wherein the one or more spacers are between the second surface of the barrier region and the first surface of the insulating layer, and the spacers are in contact with the first surface of the insulating layer, the second surface of the barrier region, and the sidewall surface of the barrier region; and
a conductive region on the barrier region;
a first coating region extending around and above the conductive body, in contact with the barrier region and the conductive region of the conductive body, and spaced apart by a distance from the first surface of the insulating layer; and
a second coating region extending around and above the first coating region and between the first coating region and the first surface of the insulating layer, the second coating region completely sealing the first coating region from the insulating layer, and the second coating region covering and contacting one or more end sidewall surfaces of the one or more spacers.

7. The integrated circuit according to claim 6, wherein a portion of the first coating region that extends around sidewalls of the conductive body has a third surface directly facing the surface of the insulating layer, at a distance from the surface of the insulating layer comprised between 10 nm and 100 nm.

8. The integrated circuit according to claim 6 wherein the conductive region is made of copper, the first coating region is made of nickel, and the second coating region is made of palladium.

9. The integrated circuit according to claim 6, further comprising an interconnection layer extending below the insulating layer, and wherein the barrier region of the conductive body extends below the first surface of the insulating layer, completely through the insulating layer, up to being in contact with the interconnection layer.

10. A device, comprising:
a substrate having a first surface;
a conductive via in the substrate;
a conductive interconnection layer is on and coupled to the conductive via;
a recesses extends into the first surface of the substrate and through the substrate, the recess exposes the conductive interconnection layer;
a conductive barrier layer extends into the recess, is coupled to the conductive interconnection layer exposed by the recess, and is on the first surface of the substrate;
a conductive layer is in the recess and is on the conductive barrier layer;
a first coating layer on the conductive layer and at least partially on a portion of a side surface of the conductive barrier layer on the first surface of the substrate;
an opening between the first coating layer and the first surface of the substrate and between a second surface of the conductive barrier layer and the substrate;
a spacer within a first portion of the opening between the first surface of the substrate and the second surface of the barrier layer, the spacer is in contact with the first surface of the substrate and the second surface of the barrier layer, and the spacer includes an end sidewall surface that extends from the first surface of the substrate to the second surface of the conductive barrier layer; and
a second coating layer on the first coating layer, in a second portion of the opening between the first coating layer and the first surface of the substrate, and in contact with and covering the end sidewall surface of the spacer.

11. The device of claim 10 wherein the substrate includes a first insulating layer that forms the first surface of the substrate.

12. The device of claim 11 wherein the second coating layer completely separates the first coating layer from the first insulating layer.

13. The device of claim 12 wherein the substrate includes a second insulating layer that is covered by the first insulating layer.

14. The device of claim 13 wherein the recess includes tapered sidewalls in the first insulating layer and the second insulating layer.

15. The device of claim 9 wherein the opening has a first dimension between the first coating layer and the first surface of the substrate, and the side surface of the conductive barrier layer having a second dimension between an interface of the spacer and the conductive barrier layer and an interface between the conductive barrier layer and the conductive layer on the conductive barrier layer.

16. The device of claim 15 wherein the first dimension is different than the second dimension.

17. The device of claim 15 wherein the first dimension is less than the second dimension.

18. The device of claim 17 wherein the first coating layer is in direct contact with the side surface of the second conductive barrier layer.

19. The device of claim 10 wherein the first coating layer is in direct contact with the side surface of the conductive barrier layer.

20. The device of claim 10 further comprising an insulating layer on the first surface of the substrate and covering one or more respective sidewalls of the second coating layer.

* * * * *

UNITED STATES PATENT AND TRADEMARK OFFICE
CERTIFICATE OF CORRECTION

| | | |
|---|---|---|
| PATENT NO. | : 12,021,046 B2 | Page 1 of 1 |
| APPLICATION NO. | : 17/944983 | |
| DATED | : June 25, 2024 | |
| INVENTOR(S) | : Paolo Colpani et al. | |

It is certified that error appears in the above-identified patent and that said Letters Patent is hereby corrected as shown below:

In the Claims

Column 12, Claim 1, Line 30:
"insulating layer; and" should read: -- insulating layer; --.

Column 12, Claim 3, Line 56:
"made of nicker and" should read: -- made of nickel; and --.

Column 13, Claim 10, Line 56:
"a recesses extends" should read: -- a recess extends --.

Column 14, Claim 15, Line 38:
"The device of claim 9 wherein" should read: -- The device of claim 10 --.

Column 14, Claim 18, Lines 49-50:
"side surface of the second conductive barrier layer." should read: -- side surface of the conductive barrier layer. --.

Signed and Sealed this
Thirteenth Day of August, 2024

Katherine Kelly Vidal
*Director of the United States Patent and Trademark Office*